(12) United States Patent
Jao

(10) Patent No.: US 8,692,605 B2
(45) Date of Patent: Apr. 8, 2014

(54) RECEIVING CIRCUITS FOR CORE CIRCUITS

(75) Inventor: Che-Yuan Jao, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 172 days.

(21) Appl. No.: 13/169,467

(22) Filed: Jun. 27, 2011

(65) Prior Publication Data

US 2012/0326753 A1 Dec. 27, 2012

(51) Int. Cl.
*H03K 5/08* (2006.01)
*H03K 19/00* (2006.01)

(52) U.S. Cl.
CPC . *H03K 5/08* (2013.01); *H03K 19/00* (2013.01)
USPC ............................. 327/309; 327/333; 327/315

(58) Field of Classification Search
CPC ............ H03K 5/08; H03K 19/00; H03K 5/00
USPC .................. 327/108, 333, 306, 309, 315, 318
See application file for complete search history.

(56) References Cited

U.S. PATENT DOCUMENTS

| | | | |
|---|---|---|---|
| 5,333,093 A * | 7/1994 | Krautschneider et al. ...... | 361/56 |
| 6,501,318 B1 * | 12/2002 | Randazzo et al. ............ | 327/309 |
| 7,268,633 B2 * | 9/2007 | von Kaenel ...................... | 331/17 |
| 2002/0024864 A1 * | 2/2002 | Sudo et al. ..................... | 365/207 |
| 2005/0286333 A1 * | 12/2005 | Gupta et al. ................... | 365/226 |
| 2007/0285134 A1 * | 12/2007 | Peterson ....................... | 327/109 |
| 2008/0068910 A1 * | 3/2008 | Jao ................................ | 365/206 |
| 2008/0137472 A1 | 6/2008 | Schnell et al. | |
| 2012/0253418 A1 * | 10/2012 | Mower ............................ | 607/18 |
| 2012/0292308 A1 * | 11/2012 | Fennewald et al. ........... | 219/552 |
| 2012/0317451 A1 * | 12/2012 | Whetsel ........................ | 714/726 |

* cited by examiner

*Primary Examiner* — Ryan Jager
(74) *Attorney, Agent, or Firm* — McClure, Qualey & Rodack, LLP

(57) ABSTRACT

A receiving circuit for a core circuit is provided and includes a first receiving-path unit. The first receiving-path unit is capable of receiving an input signal and outputting an output signal to the core circuit according to the input signal. The first receiving-path unit includes an input buffer which is capable of operating in a core power domain of the core circuit and receiving a first clamped signal. When a level of the input signal is substantially equal to or lower than a first predetermined voltage level, the input signal is passed to the input buffer to serve as the first clamped signal, and the input buffer is capable of outputting the output signal in the core power domain according to the first clamped signal. When the level of the input signal is higher than the first predetermined voltage level, the input signal is not passed to the input buffer.

20 Claims, 21 Drawing Sheets

RECEIVING CIRCUITS FOR CORE CIRCUITS

BACKGROUND OF THE INVENTION

1. Field of the Invention

The invention relates to a receiving circuit, and more particularly to a receiving circuit compatible with core circuits with different specification requirements.

2. Description of the Related Art

FIG. 1 shows a conventional receiving circuit having multiple output signals. Referring to FIG. 1, a receiving circuit 1 receives an input signal SIN and a reference signal SREF and includes path units 10 and 11 which generate output signals OUT10 and OUT11 respectively. The receiving circuit 1 is a part of an input/output (I/O) circuit which a core circuit is coupled to. The core circuit coupled to the receiving circuit 1 receives the output signal OUT10 and/or OUT11. The path unit 10 is used to generate the output signal OUT10 complying with a stub series terminated logic (SSTL) standard to a core circuit, such as a double data rate I (DDRI), DDRII, or DDRIII memories. The path unit 10 receives both of the input signal SIN and the reference signal SREF according to the SSTL standard and includes a differential receiver 100 and a level shifter 101. The path unit 11 is used to generate the output signal OUT11 complying with a low voltage transistor to transistor logic (LVTTL) standard to a core circuit, such as a mobile DDR or single data rate (SDR) memory. The path unit 11 receives only the input signal SIN according to the LVTTL standard and includes a single-end receiver 110 and a level shifter 111. Both of the differential receiver 100 and the single-end receiver 110 operate at an I/O power domain and receive an I/O power voltage VDDH and an I/O ground voltage VSSH of the I/O power domain. The value of the I/O power voltage VDDH can be determined according to the specification of a core circuit coupled to the receiving circuit 1. For example, the I/O power voltage VDDH can be 3.3V for an SDR memory, 2.5V for a DDRI memory, 1.8V for a DDRII or mobile DDR memory, or 1.5V for a DDRIII memory. The level shifters 101 and 111 receive the I/O power voltage VDDH and the I/O ground voltage VSSH of the I/O power domain and further receive a core power voltage VDDL and a core ground voltage VSSL of a core power domain. The level shifters 101 and 111 shift levels of respective output signals of the receivers 100 and 110, so that the output signals OUT10 and OUT11 respectively generated by the level shifters 101 and 111 are in the core power domain. The core circuit receives the output signal OUT10 or OUT11 according to its specification requirements.

Referring to FIG. 1 and FIGS. 2A~2I, the differential receiver 100 includes positive input terminal (+) (represented by DP in FIGS. 2A~2I) and negative input terminal (−) (represented by DN in FIGS. 2A~2I) for respectively receiving the input signal SIN and the reference signal SREF and further includes an output terminal (represented by OUT in FIGS. 2A~2I). FIGS. 2A~2I show different circuitries of the differential receiver 100. The differential receiver 100 operates at the I/O power domain. The circuitries in FIGS. 2A~2I are formed by thick gate I/O devices (i.e. devices with thick gate dielectric) to tolerate the I/O power voltage VDDH and an I/O ground voltage VSSL of the I/O power domain and the incoming signals SIN and SREF. Thus, the differential receiver 100 occupies a large area.

Memories with low power and high speed data-rates, such as low power double data rate II (LPDDRII) memory, becomes more and more popular. An LPDDRII memory adopts signals complying with the SSTL standard, thus the path unit 10 may be used for the LPDDRII memory. According to the specification of an LPDDRII memory, the value of the I/O power voltage VDDH must be lowered to 1.2V. Thus, when the receiving circuit 1 is requested to be compatible with an LPDDRII memory and other memories of different specifications, such as a mobile DDR, a DDRII, and DDRIII memories, meeting the high speed data-rate requirements of the LPDDRII memory becomes difficult. Specifically, in the differential receiver 100 of the path unit 10 formed by the thick gate I/O devices, at least three thick gate I/O devices are cascaded, resulting in insufficient voltage headroom.

Thus, it is desired to provide a receiving circuit compatible with core circuits having different specification requirements, wherein the core circuits in particular, include a low voltage core circuit.

BRIEF SUMMARY OF THE INVENTION

One exemplary embodiment of a receiving circuit for a core circuit includes a first receiving-path unit. The first receiving-path unit is capable of receiving an input signal and outputting an output signal to the core circuit according to the input signal. The first receiving-path unit includes an input buffer which is capable of operating in a core power domain of the core circuit and receiving a first clamped signal. When a level of the input signal is substantially equal to or lower than a first predetermined voltage level, the input signal is passed to the input buffer to serve as the first clamped signal, and the input buffer is capable of outputting the output signal in the core power domain according to the first clamped signal. When the level of the input signal is higher than the first predetermined voltage level, the input signal is not passed to the input buffer.

Another exemplary embodiment of a receiving circuit for a core circuit includes a first receiving-path unit and a second receiving-path unit. The first receiving-path unit is capable of receiving an input signal and outputting a first output signal to the core circuit according to the input signal. The first receiving-path unit includes a first input buffer which is capable of operating in a core power domain of the core circuit and receiving a first clamped signal. When a level of the input signal is substantially equal to or lower than a first predetermined voltage level, the input signal is passed to the first input buffer serve as the first clamped signal, and the first input buffer is capable of outputting the first output signal in the core power domain according to the first clamped signal. The second receiving-path unit is capable of receiving the input signal and outputting a second output signal to the core circuit according to the input signal. The second receiving-path unit includes a second input buffer and a first level shifter. The second input buffer is capable of operating in an input/output (I/O) power domain of the receiving circuit, receiving the input signal, and outputting a first buffer signal according to the input signal. The first level shifter is capable of receiving the first buffer signal and shifting a level of the first buffer signal to generate the second output signal in the core power domain.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Receiving circuits are provided. In an exemplary embodiment of a receiving circuit FIG. 3, a receiving circuit 3 includes a receiving-path unit 30 which includes at least one voltage clamper 300 and an input buffer 301. The receiving-path unit 30 is capable of receiving an input signal SIN and outputting an output signal OUT30. The receiving circuit 3 may be a part of an input/output (I/O) circuit which a core circuit is coupled to. The core circuit coupled to the receiving circuit 3 may receive the output signal OUT30. The core circuit can be a low power device, such as a low power double data rate II (LPDDRII) memory. Thus, the receiving-path unit 30 has to output the output signal OUT30 conforming to the specification requirements of the core circuit such as LPDDRII memory. One skilled in the art knows that an LPDDRII memory adopts signals complying with a stub series terminated logic (SSTL) standard. Accordingly, the receiving circuit 3 can include two voltage clampers 300A and 300B which receive the input signal SIN and a reference signal SREF and provide clamped signals S300A and S300B, respectively. In the embodiment, the input buffer 301 is a differential receiver capable of operating in a core power domain and receiving the clamped signals S300A and S300B respectively from the voltage clampers 300A and 300B.

Figure 1:
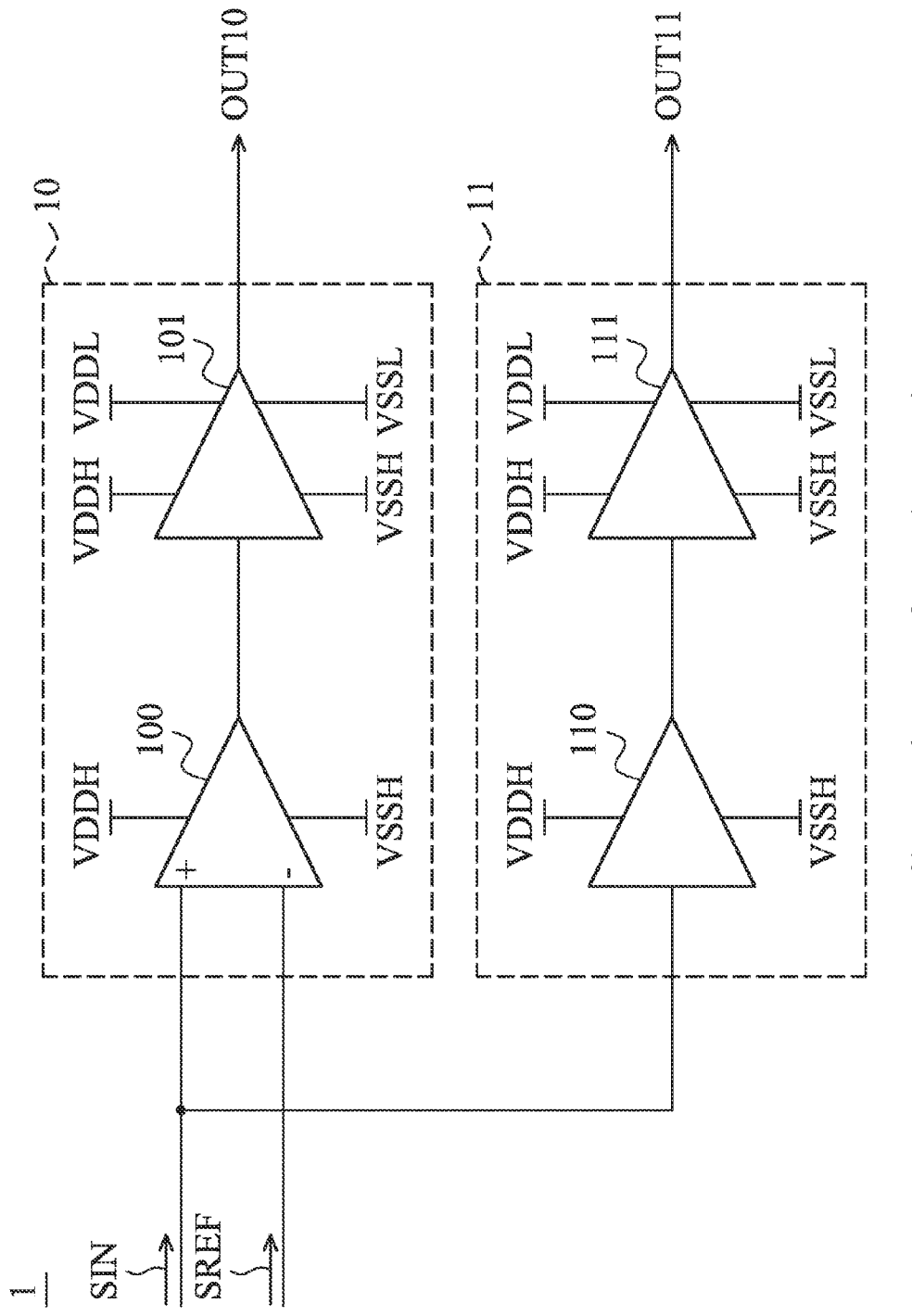
FIG. 1 shows a conventional receiving circuit having multiple output signals.
Figure 2A:
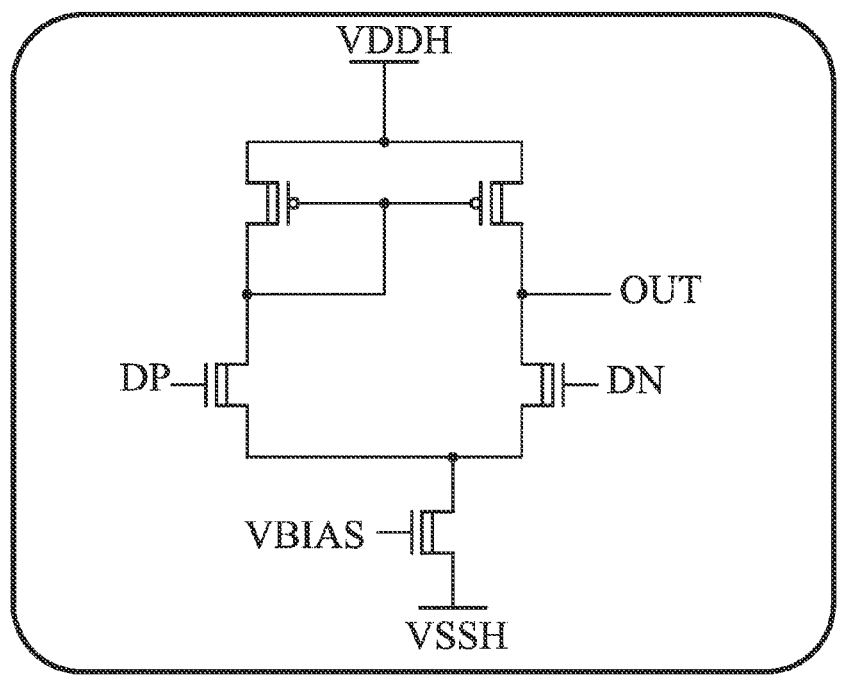
FIGS. 2A~2I show different circuitries of a differential receiver in the receiving circuit of FIG. 1.
Figure 2B:
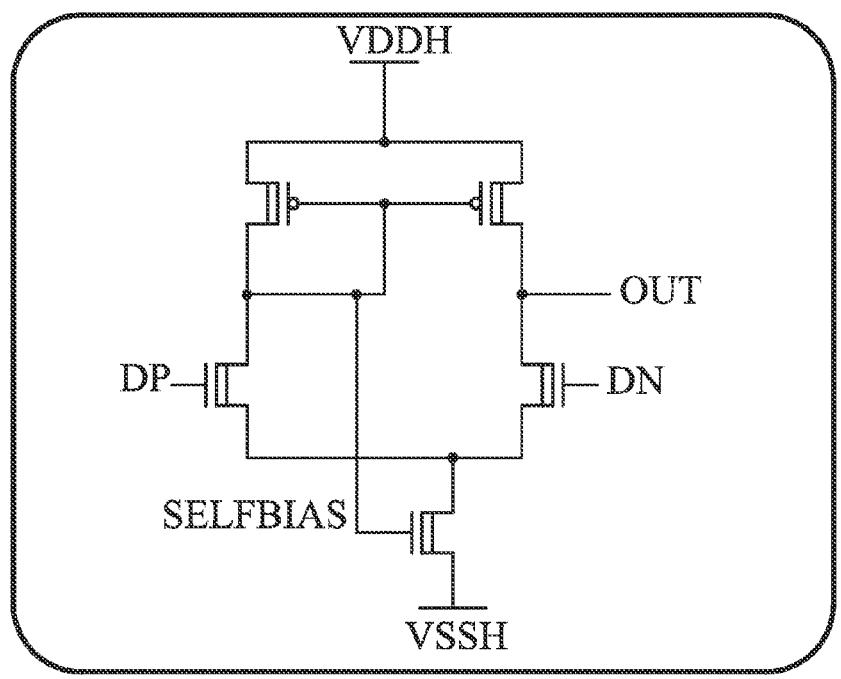
Figure 2C:
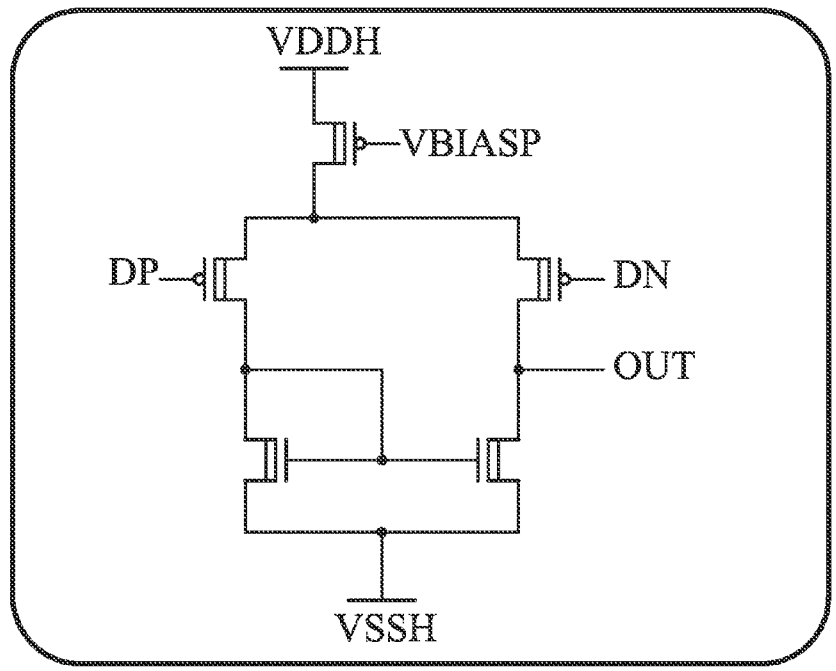
Figure 2D:
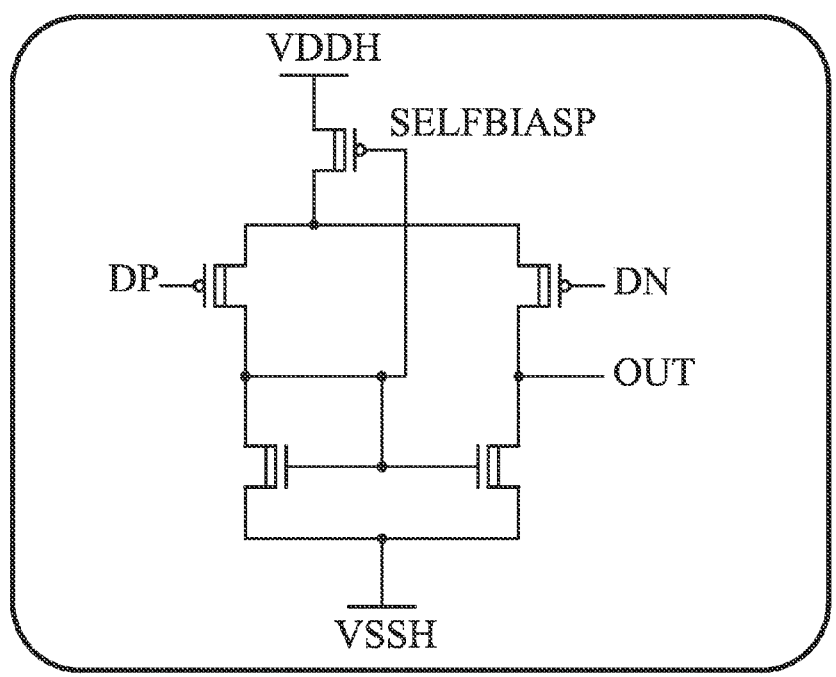
Figure 2E:
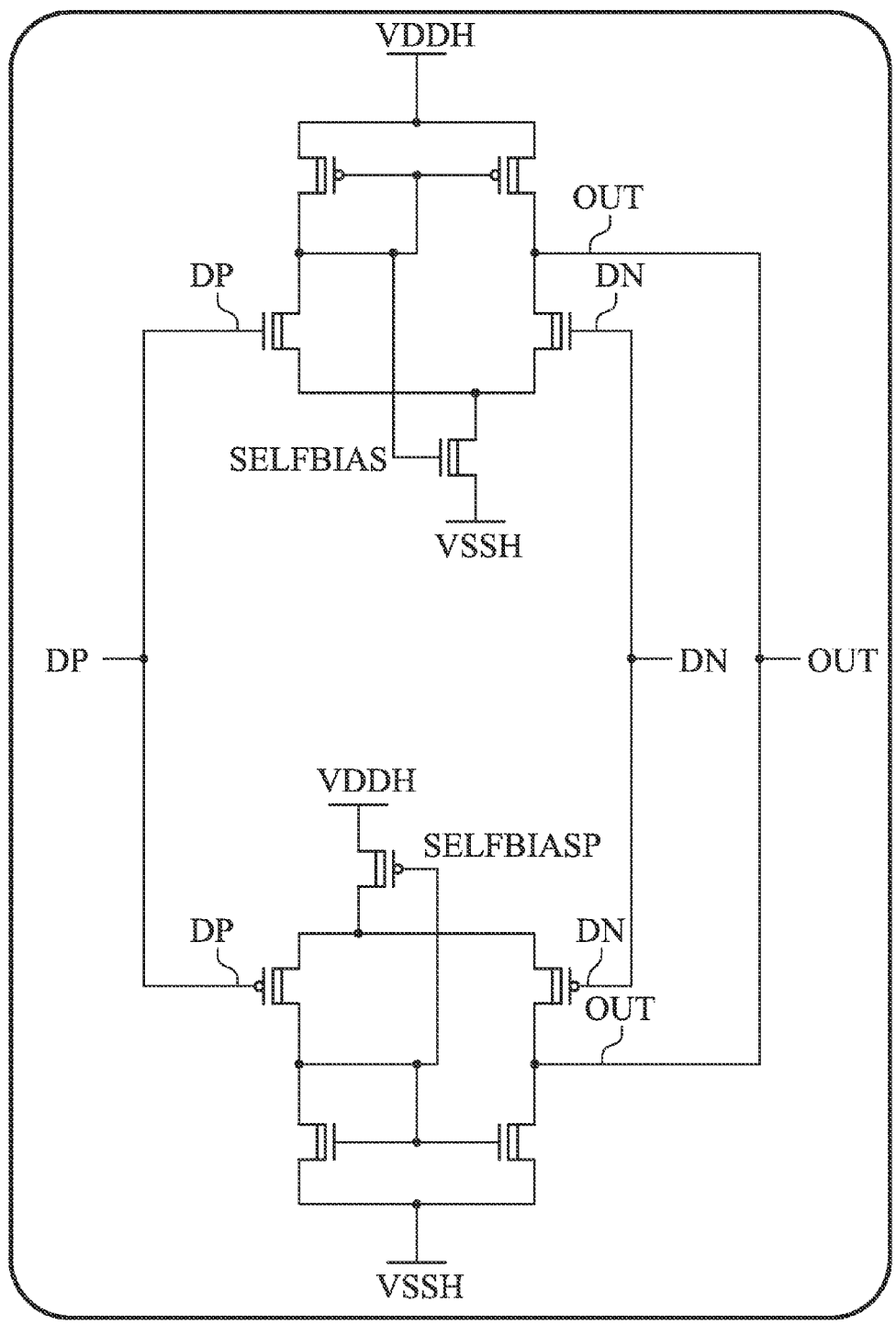
Figure 2F:
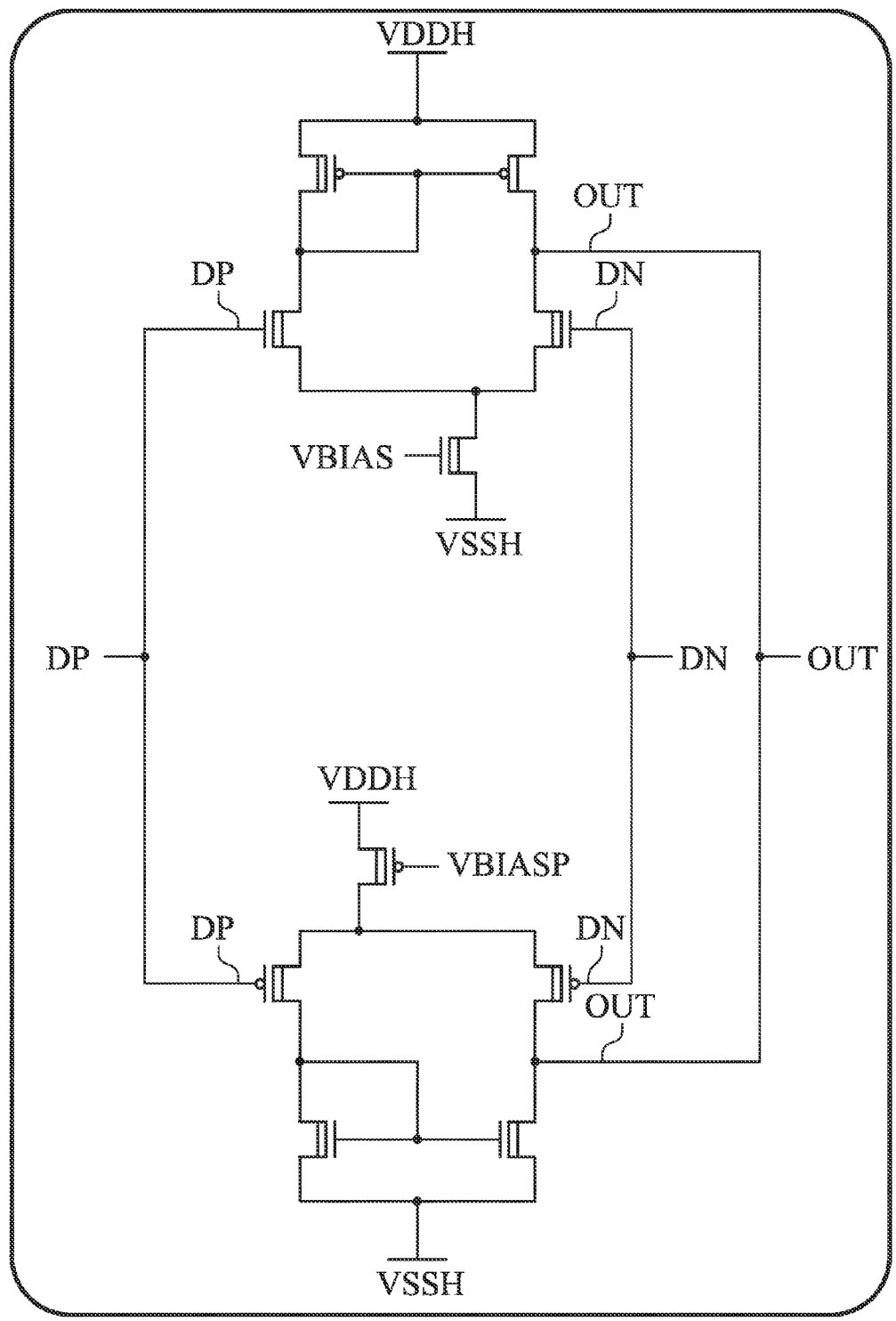
Figure 2G:
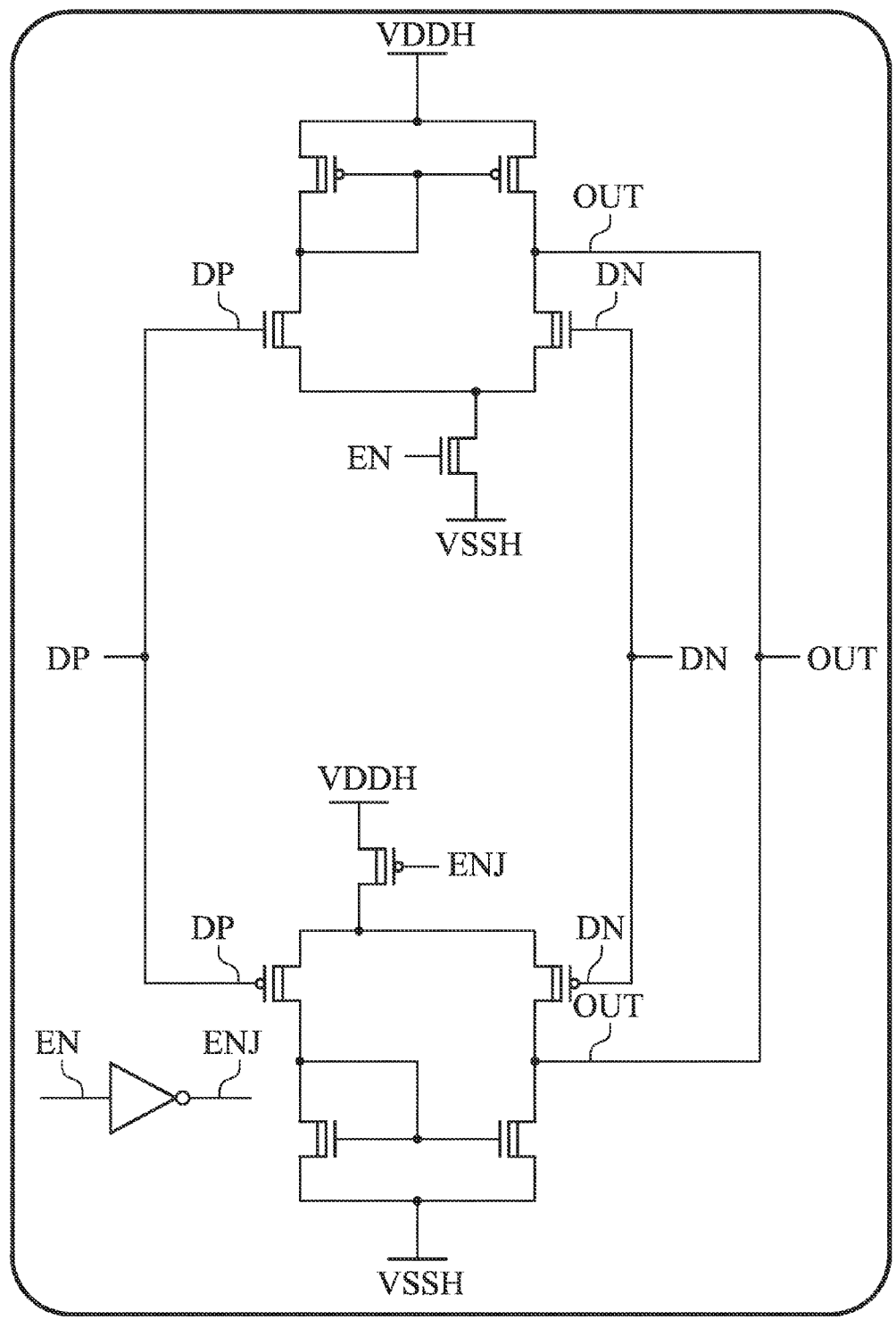
Figure 2H:
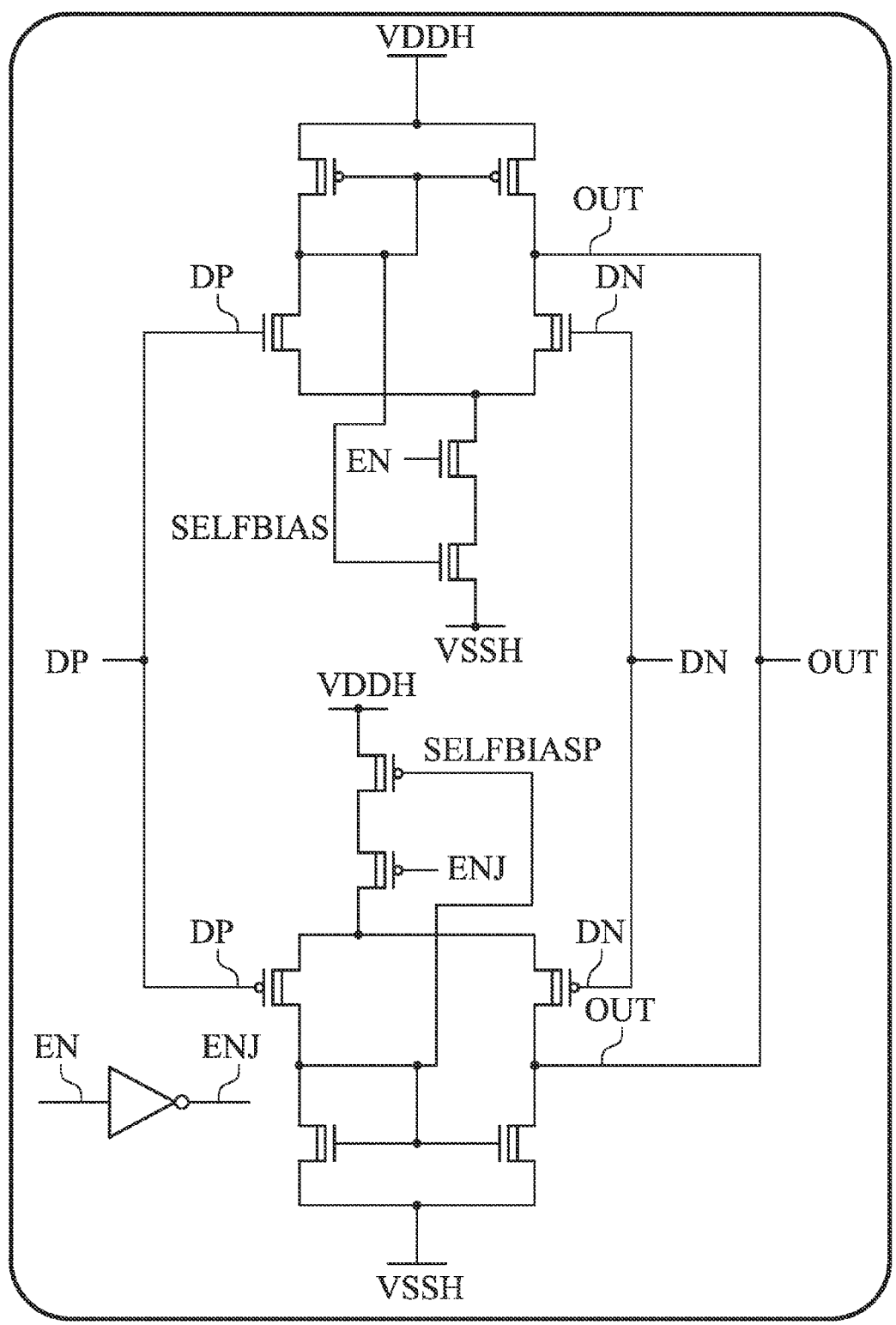
Figure 2I:
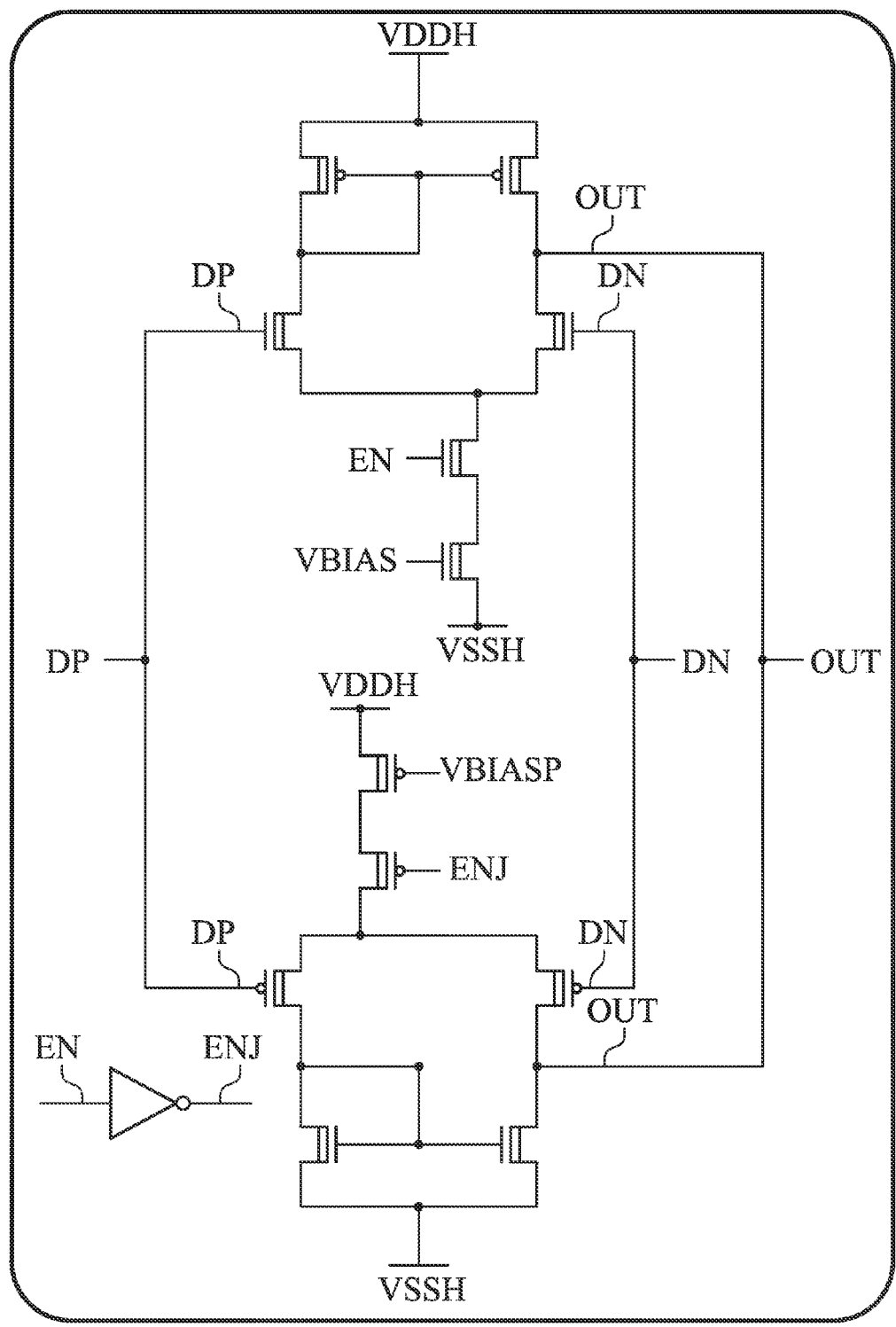
Figure 3:
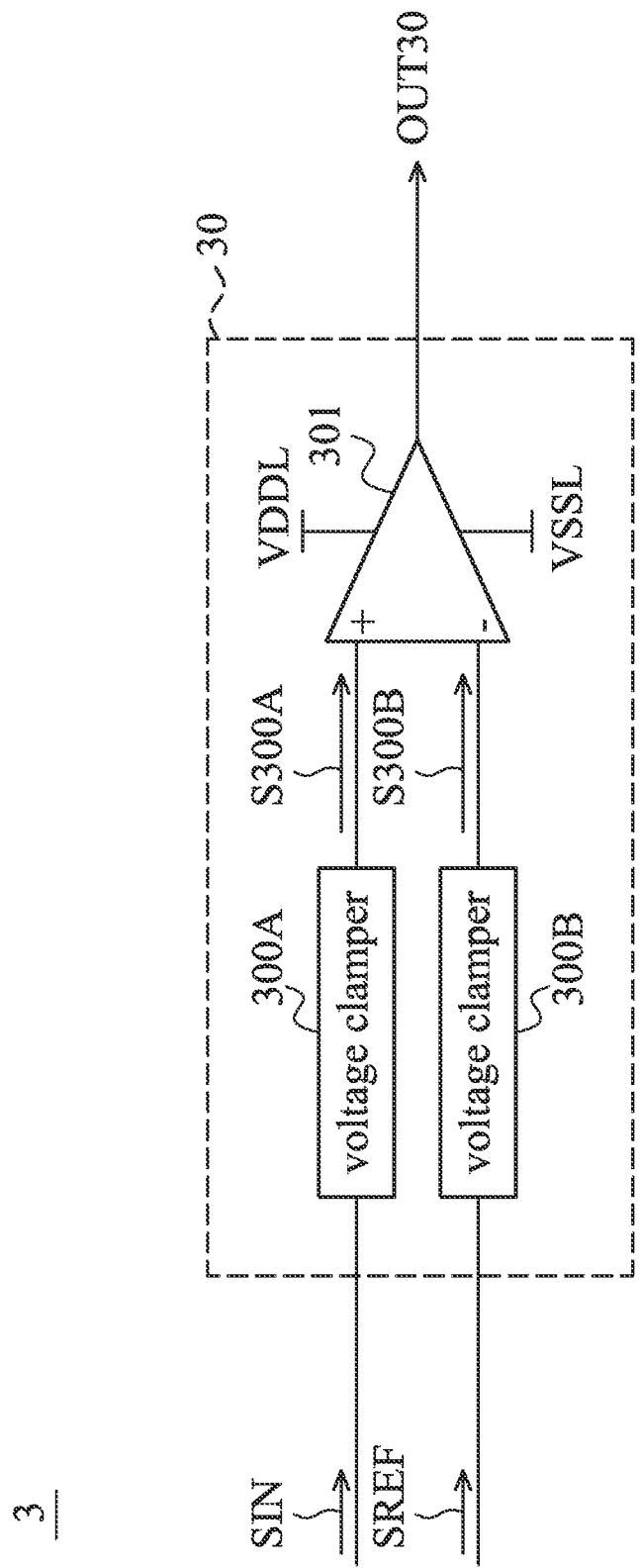
FIG. 3 shows one exemplary embodiment of a receiving circuit.
Figure 4A:
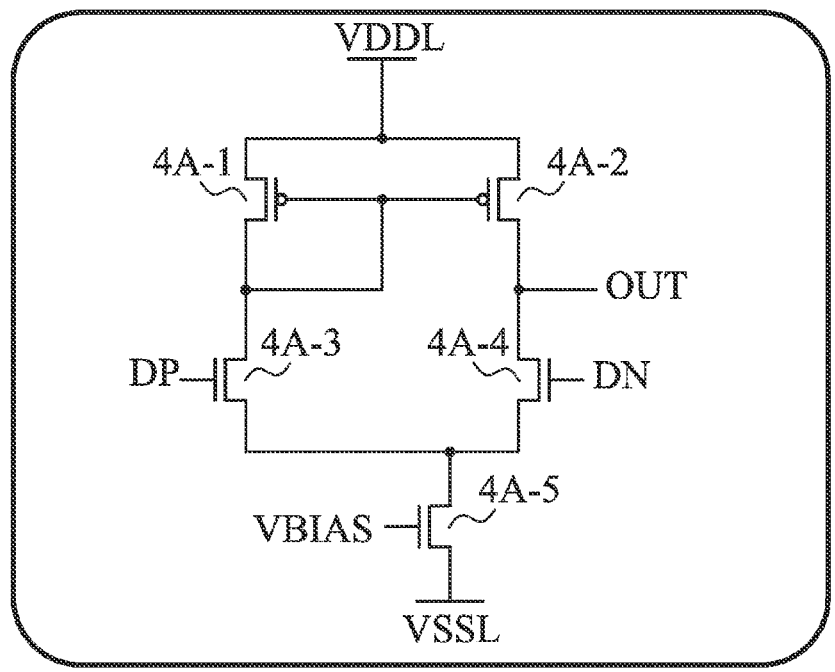
FIGS. 4A~4I show exemplary embodiments of a differential receiver in the receiving circuit of FIG. 3.
Figure 4B:
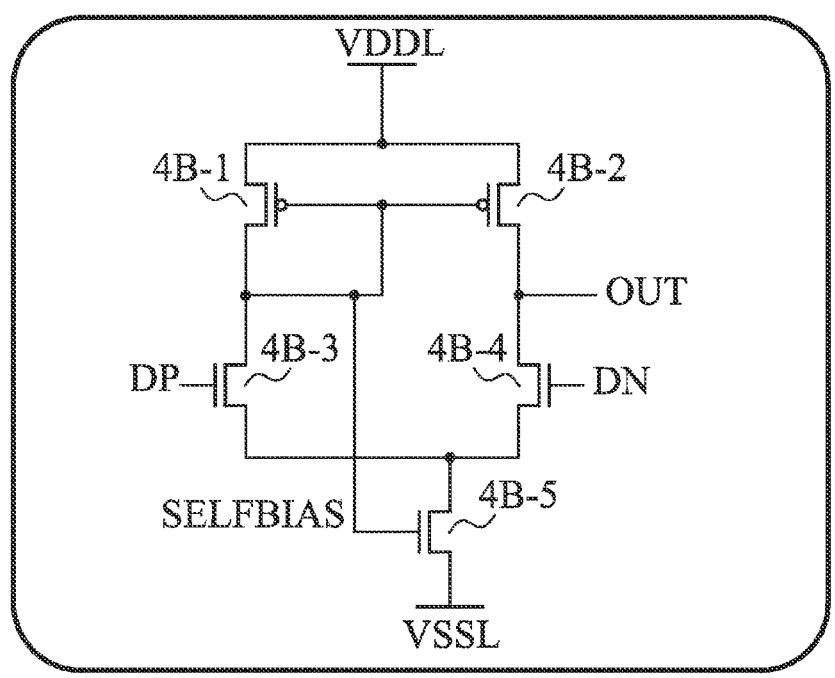
Figure 4C:
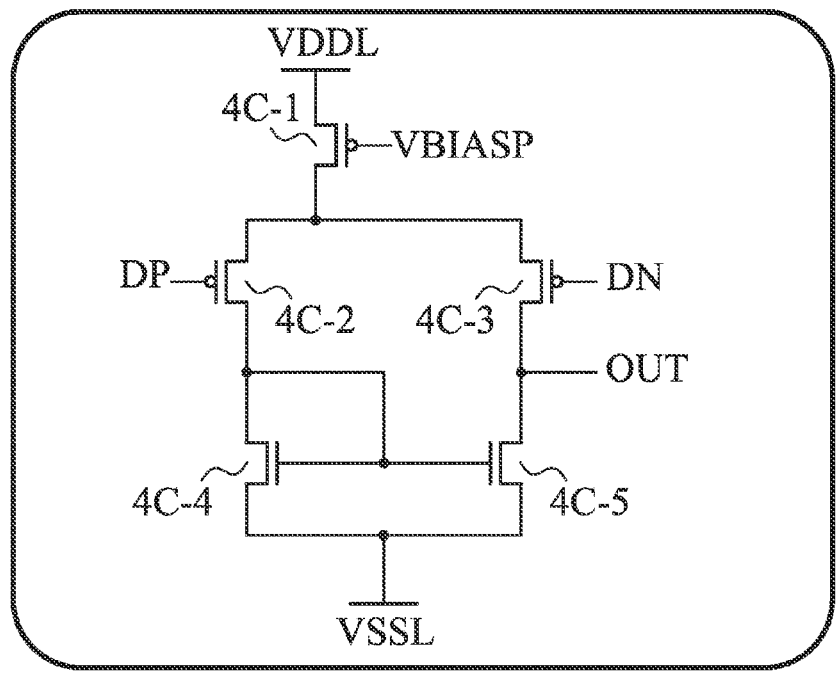
Figure 4D:
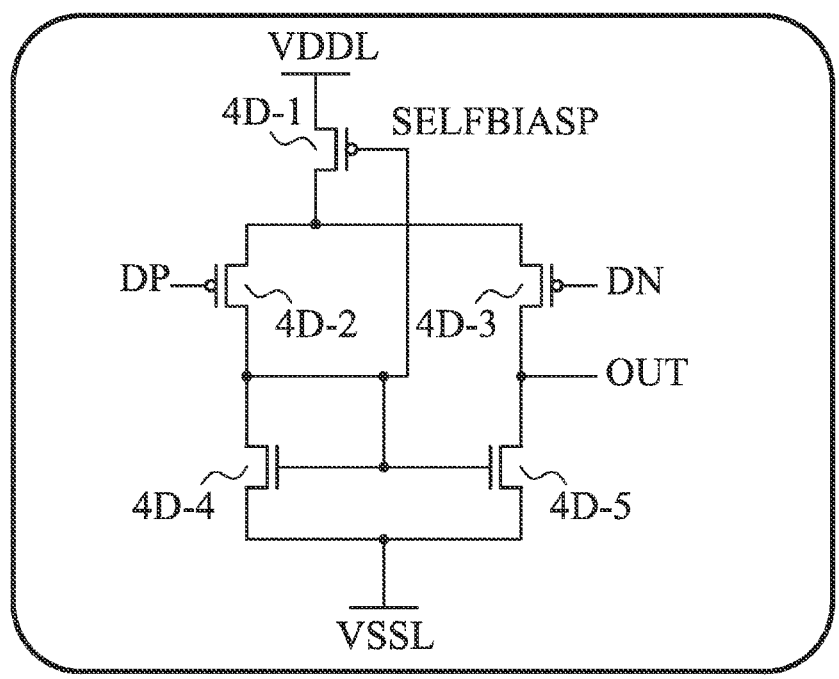
Figure 4E:
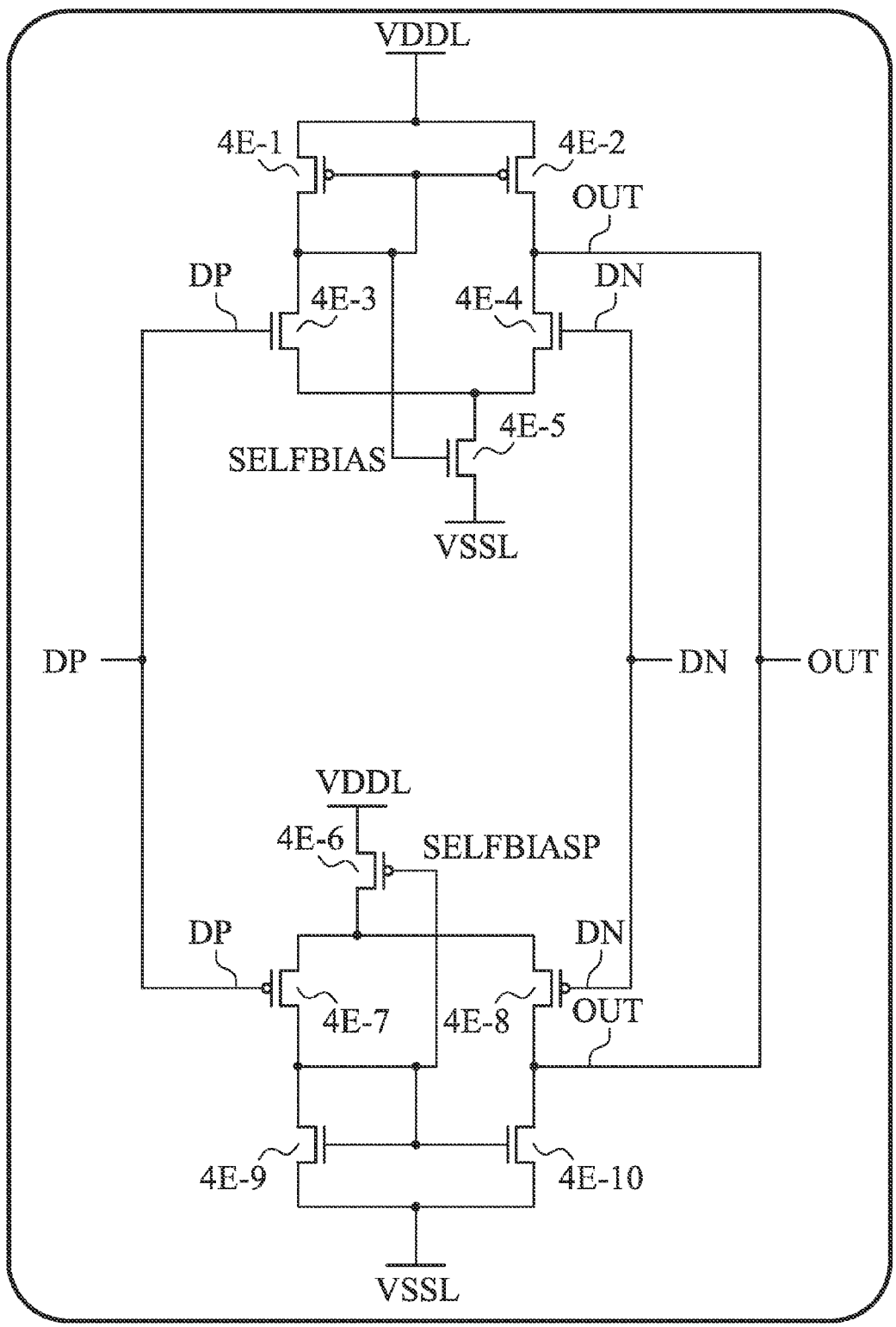
Figure 4F:
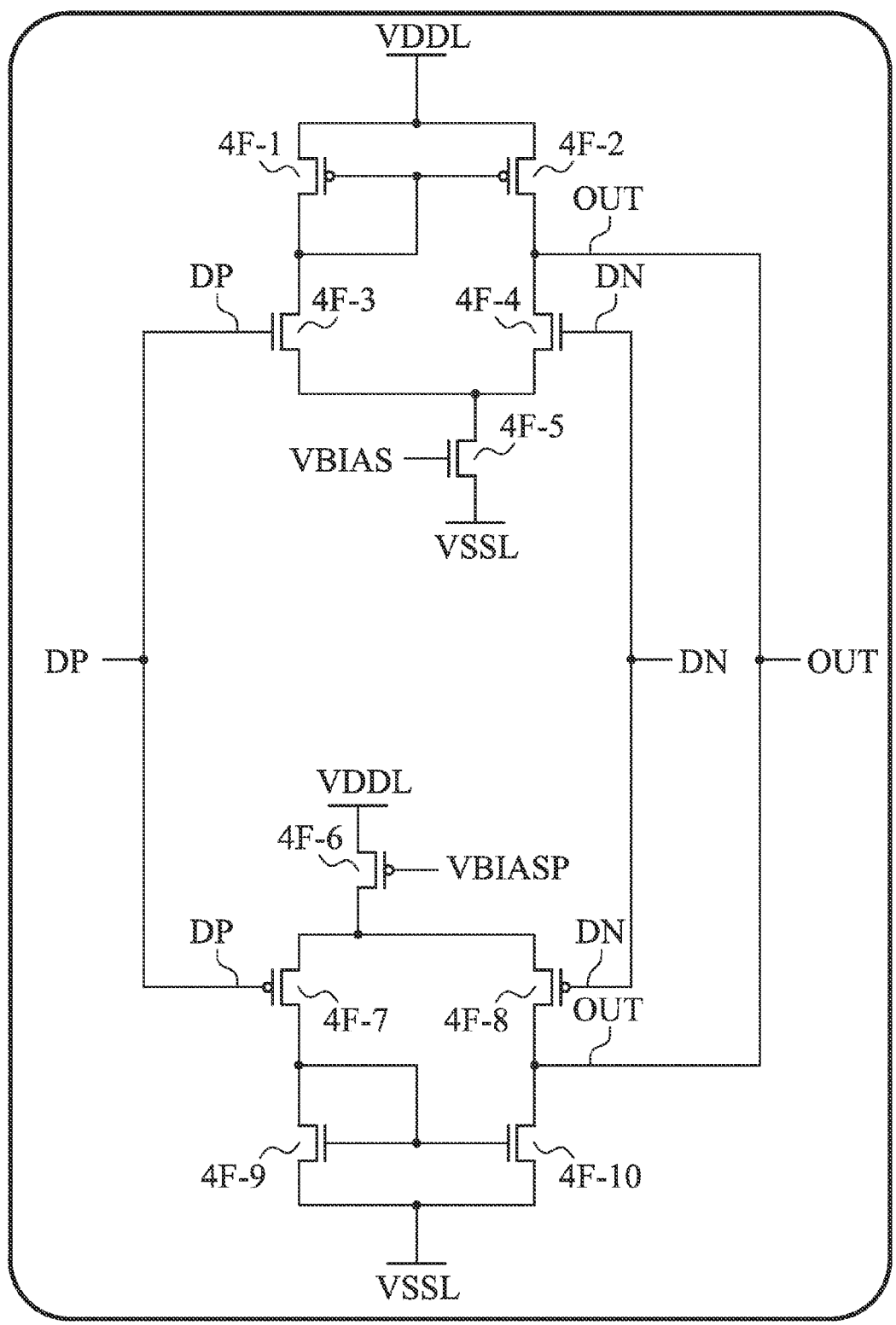
Figure 4G:
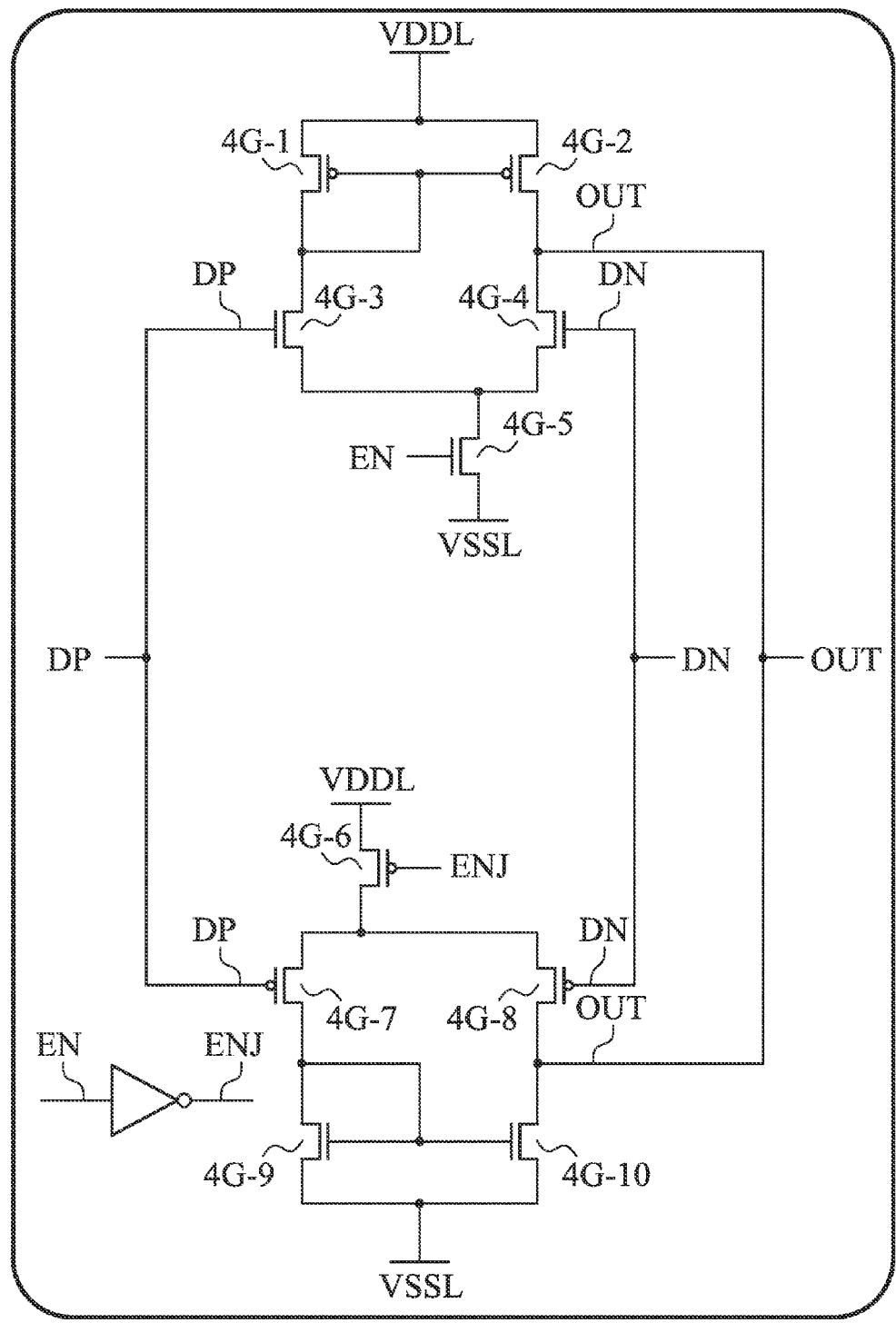
Figure 4H:
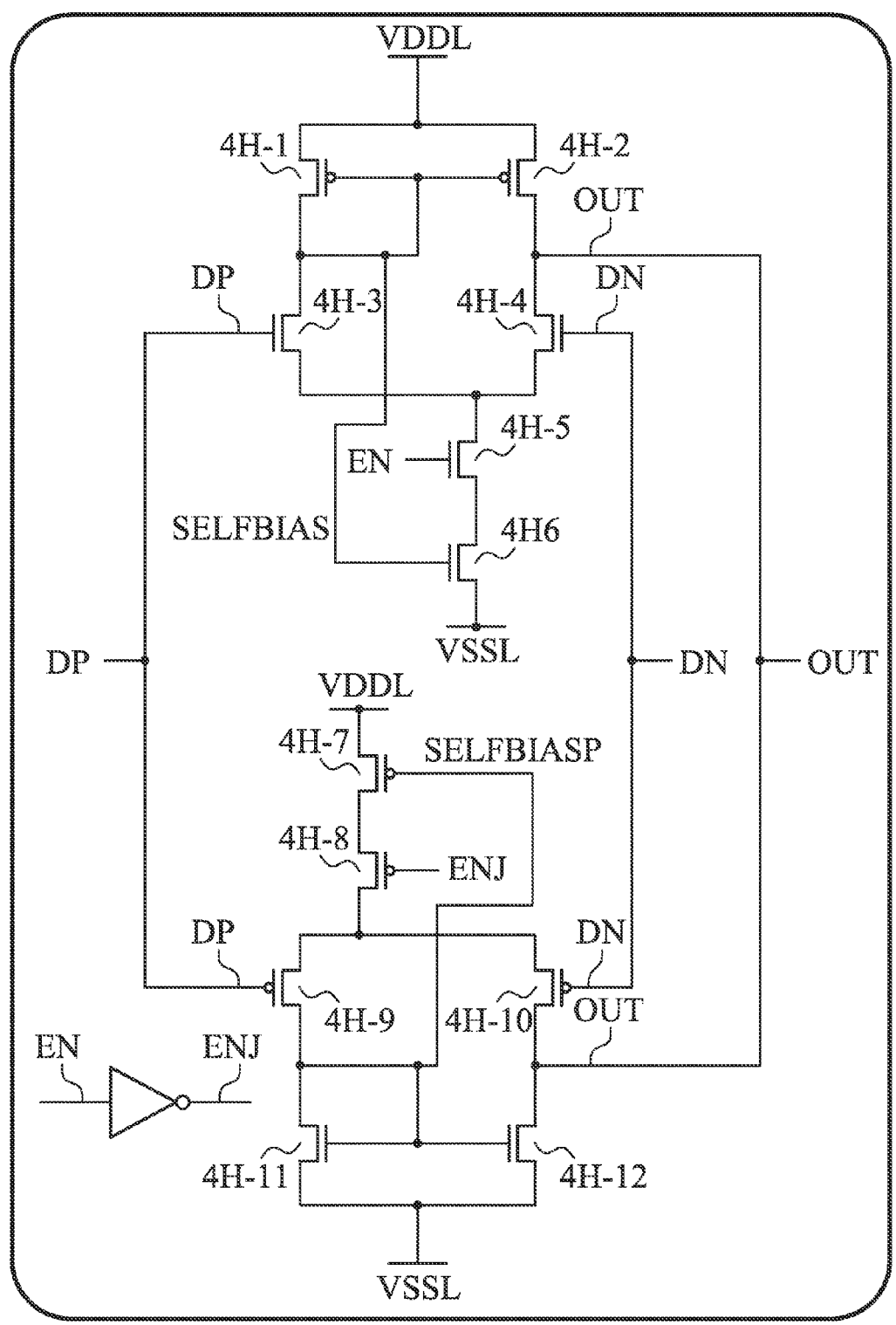
Figure 4I:
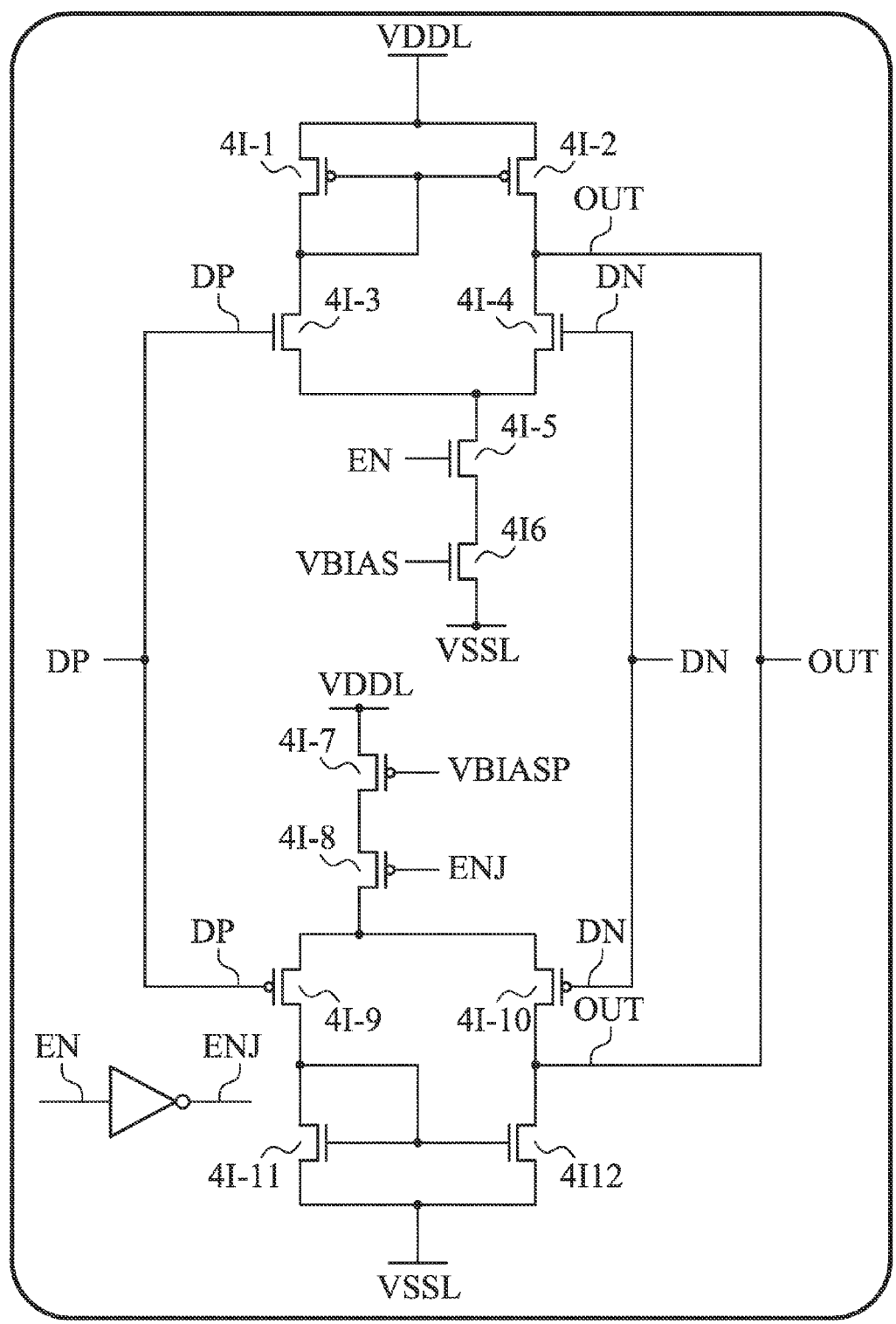

Referring to FIG. 3, the voltage clamper 300A is capable of receiving the input signal SIN with a variable level and providing the clamped signal S300A to the differential receiver 301. When the level of the input signal SIN is substantially equal to or lower than a first predetermined voltage level, the voltage clamper 300A is capable of passing the input signal SIN to serve as the clamped signal S300A, and the clamped signal S300A is provided to a positive input terminal (+) of the differential receiver 301. When the level of the input signal SIN is higher than the first predetermined voltage level, the voltage clamper 300A does not pass the input signal SIN. In this case, the voltage clamper 300A is capable of providing the clamped signal S300A whose level is not higher than the first predetermined voltage level to the positive input terminal (+) of the differential receiver 301. In this embodiment, the first predetermined voltage level can be set as a level of a core power voltage (VDDL) of a core power domain.

Referring to FIG. 3, the voltage clamper 300B is capable of receiving the reference signal SREF. When the level of the reference signal SREF is substantially equal to or lower than a second predetermined voltage level, the voltage clamper 300B is capable of passing the reference signal SREF to serve as the clamped signal S300B, and the clamped signal S300B is provided to a negative input terminal (−) of the differential receiver 301. When the level of the reference signal SREF is higher than the second predetermined voltage level, the voltage clamper 300B does not pass the reference signal SREF. In this case, the voltage clamper 300B is capable of providing the clamped signal S300B whose level is not higher than the second predetermined voltage level to the negative input terminal (−) of the differential receiver 301. One skilled in the art knows that, for an SSTL standard, the level of the reference signal SREF is substantially equal to half of the level of the I/O power voltage. Half of the level of the I/O power voltage is usually lower than the level of the core power voltage. Thus, in this embodiment, the second predetermined voltage level can be set as 0.6V (=1.2V/2), which is lower than the first predetermined voltage level. In another embodiment, the second predetermined voltage level can be substantially equal to the first predetermined voltage level that is the level of the core power voltage. In further another embodiment that the level of the reference signal SREF is substantially equal to half of the level of the I/O power voltage, which is usually lower than the level of the core power voltage and thus usually lower than the first predetermined voltage level, the voltage clamper 300B for the reference signal SREF may be omitted, and the reference signal SREF can be directly provided to the negative input terminal (−) of the differential receiver 301.

According to the operation of the voltage clampers 300A and 300B, the differential receiver 301 receives the input signal SIN and the reference signal SREF with lower levels. Accordingly, the differential receiver 301 can operate in a core power domain and output the output signal OUT30 in the core power domain. Herein core power domain is the power domain that the core devices can operate in, and I/O power domain is the power domain that the I/O devices can operate in. Herein core devices can be devices having thin gate dielectric, for example, thinner than that of I/O devices. Core devices can be referred to as thin gate devices. Herein I/O devices can be devices having thick gate dielectric, for example, thicker than that of core devices. I/O devices can be referred to as thick gate devices. Herein core devices and I/O devices can be transistors. As shown in FIG. 3, the differential receiver 301 can receive a core power voltage VDDL and a core ground voltage VSSL of the core power domain. Further, since the differential receiver 301 operates in the core power domain, at least a portion of the differential receiver 301 can be formed by core devices, which means at least a portion of the differential receiver 301 can be formed by thin gate transistors (i.e. transistors with thin gate dielectric). However, in some embodiments, at least a portion of the differential receiver 301 can be formed by I/O device, for example thick gate device, while still operates in the core power domain.

FIGS. 4A~4I show exemplary embodiments of the differential receiver 301. Labels "DP" and "DN" represent the positive input terminal (+) and the negative input terminal (−) of the differential receiver 301 respectively, and a label "OUT" represents an output terminal of the differential receiver 301 for outputting the output signal OUT30. In FIGS. 4A~4I, when at least a portion of the differential receiver 301 is formed by core devices, at least one of MOS transistors 4A-1~4A-5, 4B-1~4B-5, 4C-1~4C-5, 4D-1~4D-5, 4E-1~4E-10, 4F-1~4F-10, 4G-1~4G-10, 4H-1~4H-12, and 4I-1~4I-12 can have thin gate. Thus, the differential receiver 301 has better device gain and performance and occupies less area. Besides, though the receiver 301 in this embodiment is a differential receiver, the receiver can be a single-end receiver in other embodiments. When the receiver is a single-end receiver, it may receive only the input signal SIN.

Figure 5:
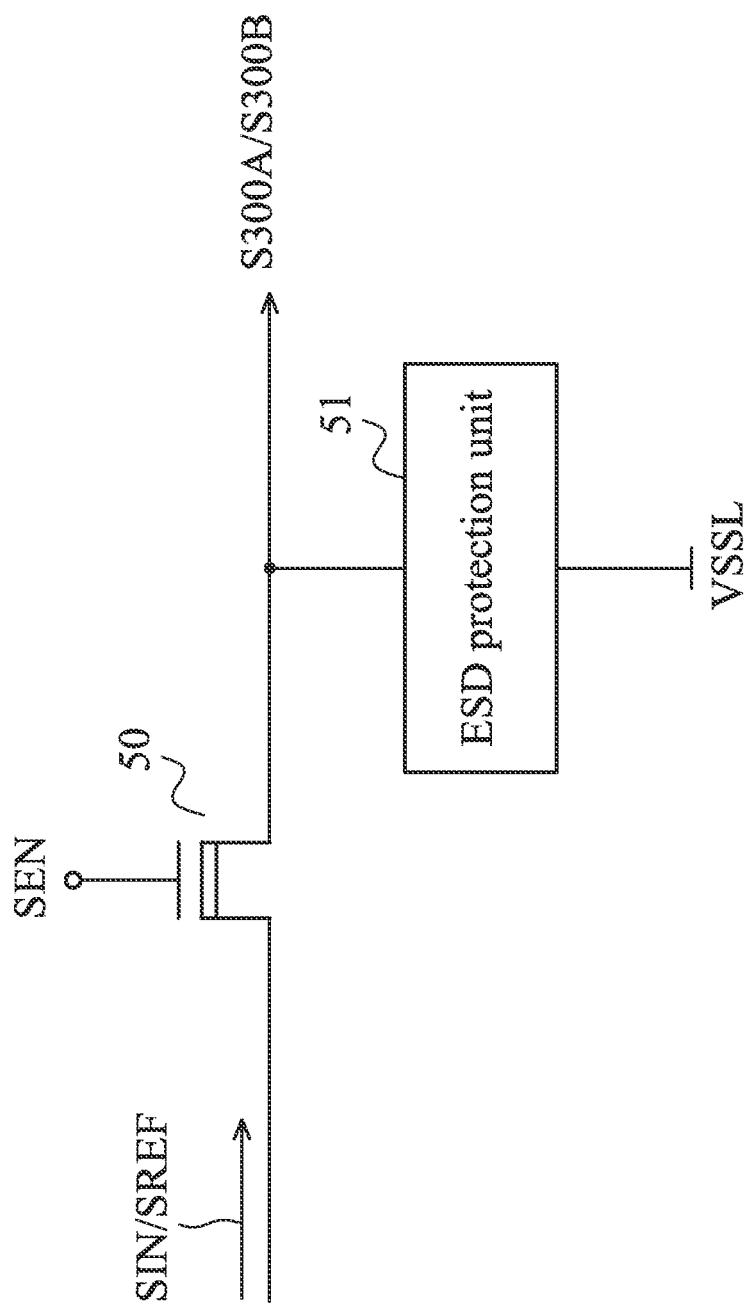
FIG. 5 shows one exemplary embodiment of voltage clampers in the receiving-path unit of FIG. 3.

FIG. 5 shows an exemplary embodiment of the voltage clampers 300A and 300B. The voltage clampers 300A and 300B may have the same structure of FIG. 5. The voltage clampers 300A and 300B can be formed by core devices, I/O devices or a combination thereof. The voltage clamper of FIG. 5 includes a switch 50 and an electrostatic discharge (ESD) protection unit 51. In this embodiment, the switch 50 can be a thick gate native NMOS transistor, for example. The switch 50 can be controlled by an enable signal SEN and has an input terminal and an output terminal The ESD protection unit 51 is coupled between the output terminal of the switch 50 and the core ground voltage VSSL. In some embodiments, the discharging path composed of the ESD protection unit 51 and the core ground voltage VSSL may be omitted. First, for a case when the voltage clamper of FIG. 5 serves as the voltage clamper 300A is described. The input terminal of the switch 50 is capable of receiving the input signal SIN and the output terminal thereof is coupled to the positive input terminal (+) of the differential receiver 301. When the level of the input signal SIN is substantially equal to or lower than the first predetermined voltage level, the enable signal SEN can be asserted to turn on the switch 50 to pass the input signal SIN to the output terminal of the switch 50 to serve as the clamped signal S300A. When the level of the input signal SIN is higher than the first predetermined voltage level, the enable signal SEN can be de-asserted to turn off the switch 50, and the input signal SIN is not passed to the output terminal of the switch 50. In this situation, the clamped signal S300A at the output terminal of the switch 50 can be substantially equal to a level of the enable signal SEN. In the embodiment, the level of the enable signal SEN can be set to be not higher than the first predetermined voltage level.

Then, for a case when the voltage clamper of FIG. 5 serves as the voltage clamper 300B is described in the following. The input terminal of the switch 50 is capable of receiving the reference signal SREF and the output terminal thereof is coupled to the negative input terminal (−) of the differential receiver 301. When the level of the reference signal SREF is substantially equal to or lower than the second predetermined voltage level, the enable signal SEN can be asserted to turn on the switch 50 to pass the reference signal SREF to the output terminal of the switch 50 to serve as the clamped signal S300B. When the level of the reference signal SREF is higher than the second predetermined voltage level, the enable signal SEN can be de-asserted to turn off the switch 50, and the reference signal SREF is not passed to the output terminal of the switch 5. In this situation, the clamped signal S300B at the output terminal of the switch 50 can be substantially equal to the level of the enable signal SEN.

Figure 6:
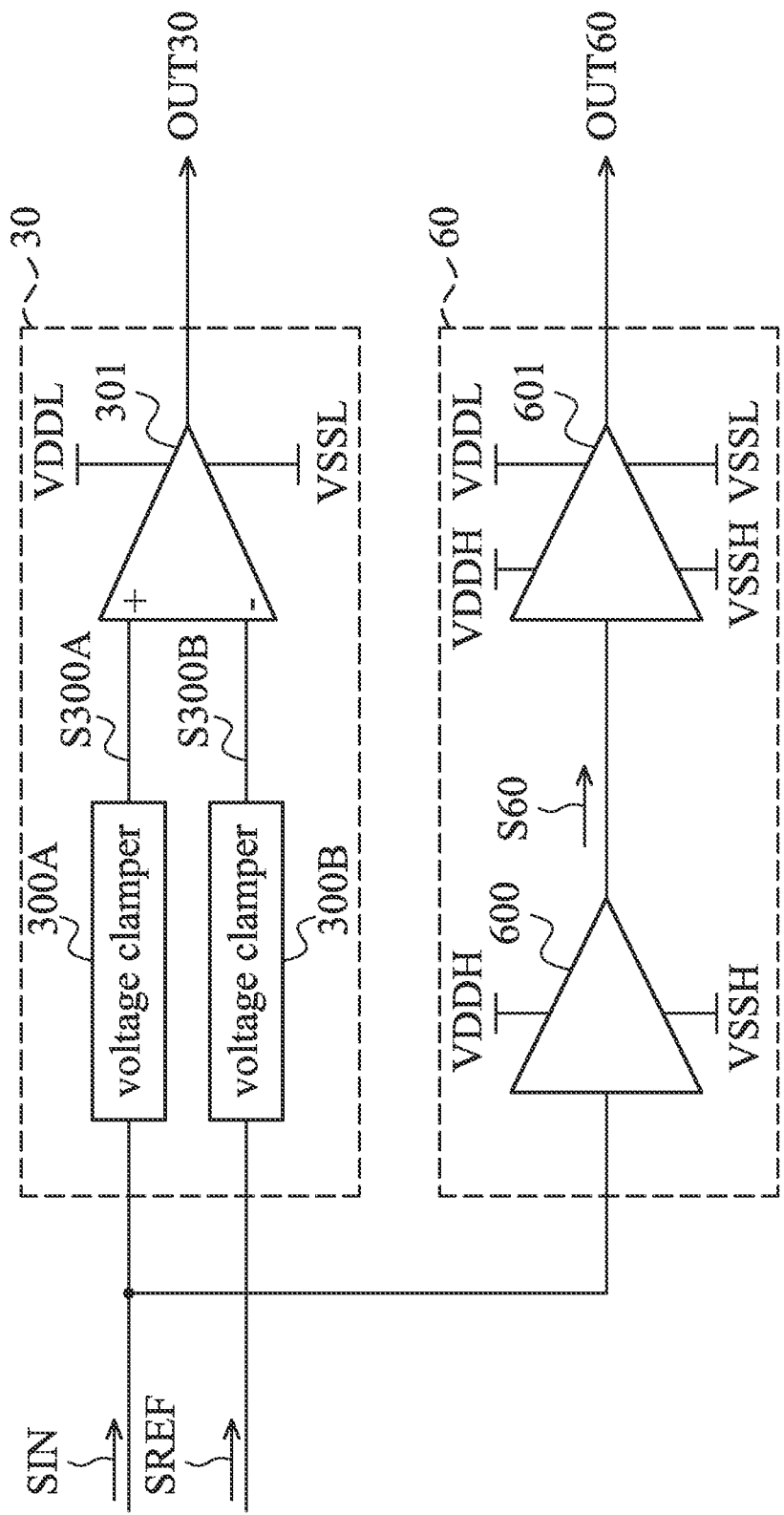
FIG. 6 shows another exemplary embodiment of a receiving circuit.

In the embodiment of FIG. 3, the receiving circuit 3 includes one receiving-path unit 30. In some embodiments, the receiving circuit 3 may include two or more receiving-path units. For example, one can be used to generate an output signal complying with the SSTL standard for a low power device, such as an LPDDRII memory, and the other one can be used to generate another output signal for a device with a different specification. As shown in FIG. 6, the receiving circuit 3 may include not only the receiving-path unit 30 of FIG. 3 but also a receiving-path unit 60. The structure and operation of the receiving-path unit 30 are described above, thus omitted here. In the embodiment of FIG. 6, the receiving-path unit 60 can be used to generate an output signal OUT60 complying with a low voltage transistor to transistor logic (LVTTL) standard. A mobile DDR or single data rate (SDR) memory may receive the output signal OUT60. As shown in FIG. 6, the receiving-path unit 60 is also capable of receiving the input signal SIN and outputting the output signal OUT60. A core circuit coupled to the receiving circuit 3 may receive the output signal OUT30, the output signal OUT60, or both according to its specification requirements. When the core circuit includes an LPDDRII memory, it may receive the output signal OUT30 from the receiving-path unit 30; when the core circuit includes a mobile DDR or SDR memory, it may receive the output signal OUT60 from the receiving-path unit 60.

Referring to FIG. 6, the receiving-path unit 60 includes an input buffer 600 and a level shifter 601. In the embodiment of FIG. 6, the input buffer 600 can be a single-end receiver. The single-end receiver 600 is capable of operating in the I/O power domain and receiving an I/O power voltage VDDH and an I/O ground voltage VSSH of the I/O power domain. The single-end receiver 600 is capable of outputting a buffer signal S60 according to the input signal SIN. The level shifter 601 is capable of receiving the I/O power voltage VDDH and the I/O ground voltage VSSH of the I/O power domain and the core power voltage VDDL and the core ground voltage VSSL of the core power domain. The level shifter 601 is capable of shifting the level of the buffer signal S60 to generate the output signal OUT60 in the core power domain.

Figure 7:
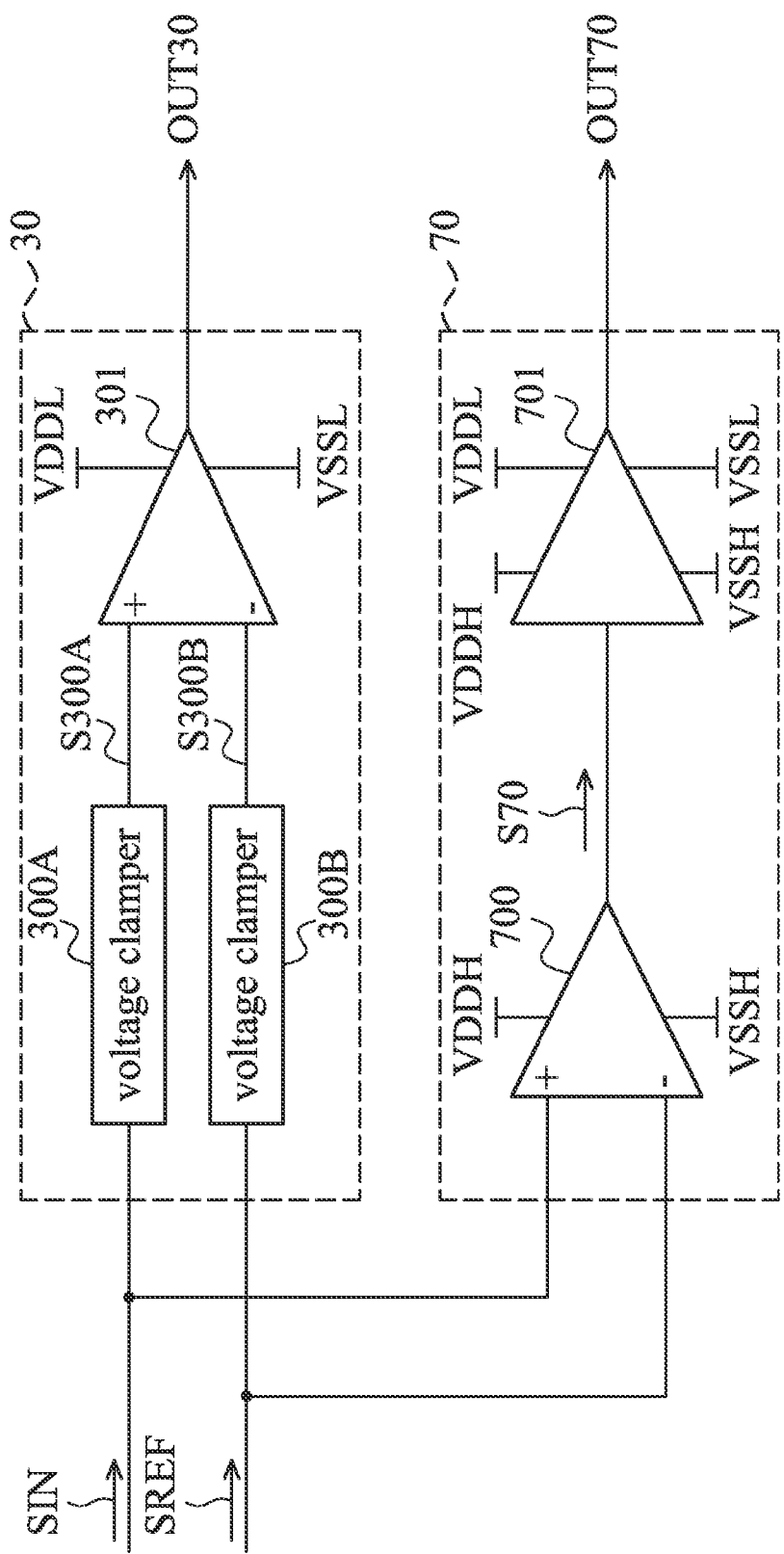
FIG. 7 shows another exemplary embodiment of a receiving circuit.

In other some embodiments, the receiving circuit 3 may include not only the receiving-path unit 30 of FIG. 3 but also a receiving-path unit 70, as shown in FIG. 7. The structure and operation of the receiving-path unit 30 are described above, thus omitted here.

In the embodiment of FIG. 7, the receiving-path unit 70 can also be used to generate an output signal OUT70 complying with the SSTL standard. A double data rate I (DDRI), DDRII, or DDRIII memory may receive the output signal OUT70. As shown in FIG. 7, the receiving-path unit 70 is also capable of receiving the input signal SIN and the reference signal SREF and outputting the output signal OUT70. A core circuit coupled to the receiving circuit 3 may receive the output signal OUT30, the output signal OUT70 or both according to its specification requirement. When the core circuit includes an LPDDRII memory, it may receive the output signal OUT30 from the receiving-path unit 30; when the core circuit includes a DDRI, DDRII, or DDRIII memory, it may receive the output signal OUT70 from the receiving-path unit 70.

Referring to FIG. 7, the receiving-path unit 70 may include an input buffer 700 and a level shifter 701. In the embodiment of FIG. 7, the input buffer 700 can be a differential receiver. The differential receiver 700 is capable of operating in the I/O power domain and receiving an I/O power voltage VDDH and an I/O ground voltage VSSH of the I/O power domain. The differential receiver 700 is capable of outputting a buffer signal S70 according to the input signal SIN and the reference signal SREF. The level shifter 701 is capable of receiving the I/O power voltage VDDH and the I/O ground voltage VSSH of the I/O power domain and the core power voltage VDDL and the core ground voltage VSSL of the core power domain. The level shifter 701 is capable of shifting the level of the buffer signal S70 to generate the output signal OUT70 in the core power domain.

Figure 8:
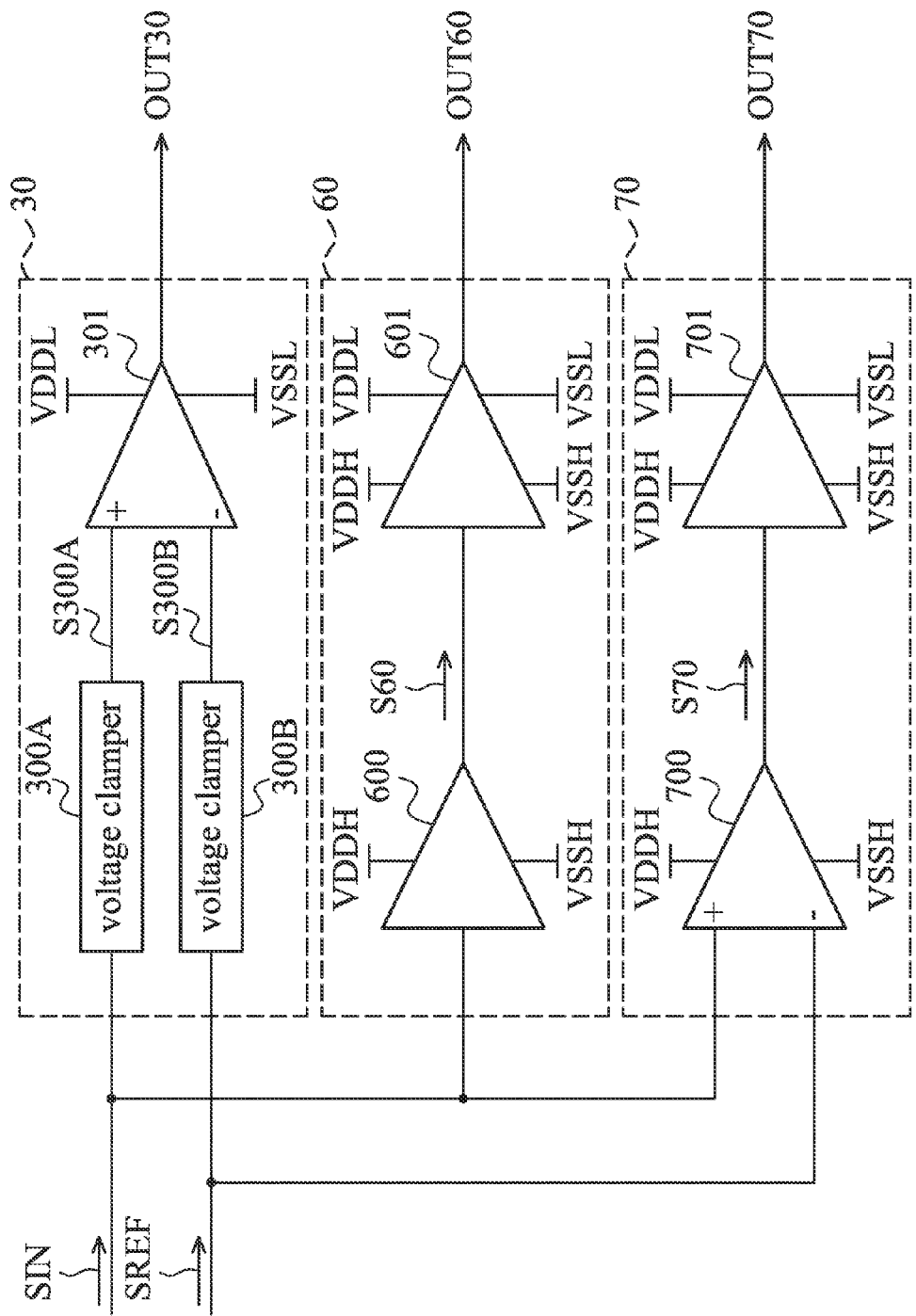
FIG. 8 shows further another exemplary embodiment of a receiving circuit.

In some embodiments, the receiving circuit 3 may include three or more receiving-path units. For example, one can be used to generate one output signal complying with the SSTL standard for an LPDDRII memory, one can be used to generate another output signal complying with the SSTL standard for a DDRI, DDRII, or DDRIII memory, and the other one can be used to generate an output signal complying with LVTTL standard for a mobile DDR or SDR memory. As shown in FIG. 8, the receiving circuit 3 may include the receiving-path unit 30 of FIG. 3, the receiving-path unit 60 of FIG. 6, and the receiving-path unit 70 of FIG. 7. The structure and operation of the receiving-path units 30, 60, and 70 are described above, thus omitted here. A core circuit coupled to the receiving circuit 3 may receive the output signal OUT30, OUT60, OUT70 or a combination thereof according to its specification requirements.

In the embodiments of FIGS. 6-8, since the differential receiver 301 is capable of operating in the core power domain, while the receivers 600 and 700 is capable of operating in the I/O power domain, the gate dielectrics of the transistors in the differential receiver 301 may be thinner than the gate dielectrics of the transistors of the receivers 600 and 700. In other words, the different receiver 301 may include thin gate devices, while the receivers 600 and 700 may include thick gate devices.

In the embodiments of FIGS. 6-8, the I/O power voltage VDDH of the I/O power domain may vary with the specification of a core circuit coupled to the receiving circuit 3. Moreover, the levels of the input signal SIN and the reference signal SREF may also vary with the specification of the core circuit. Table 1 shows core circuits complying with different specifications, corresponding I/O power voltage VDDH, and the levels of the signals SIN and SREF.

TABLE 1

| Core circuit | VDDH (V) | SIN (min-max) | SREF ($\frac{1}{2}$ * VDDH) |
| --- | --- | --- | --- |
| SDR memory | 3.3 | 0-3.3 | |
| DDRI memory | 2.5 | 0-2.5 | 1.25 |
| DDRII memory | 1.8 | 0-1.8 | 0.9 |
| DDRIII memory | 1.5 | 0-1.5 | 0.75 |
| Mobile DDR memory | 1.8 | 0-1.8 | |
| LPDDRII memory | 1.2 | 0-1.2 | 0.6 |

In the embodiments of FIGS. 6-8, since the receiving circuit 3 may include multiple receiving-path units to output several output signals, it is compatible with core circuits of different specification. For example, the receiving circuit 3 is compatible with SDR, DDRI, DDRII, DDRIII, mobile DDR, and LPDDRII memories. Thus, the input signal SIN may vary between 0-3.3V. In the embodiments, since the receiving-path unit 30 can be used to generate the output signal OUT30 to an LPDDRII memory, the voltage clamper 300A is capable of providing the clamped signal S300A whose level is not higher than 1.2V, and the voltage clamper 300B is capable of providing the clamped signal S300B whose level is not higher than 0.6V, which prevents the differential receiver 301 including thin gate devices from being damaged by the signals SIN and SREF with high levels.

In the receiving-path unit 30, the enable signal SEN controlling the switch 50 can be generated according to the I/O power voltage VDDH and the I/O ground voltage VSSH of the I/O power domain and a core power voltage VDDL and a core ground voltage VSSL of a core power domain.

Figure 9:
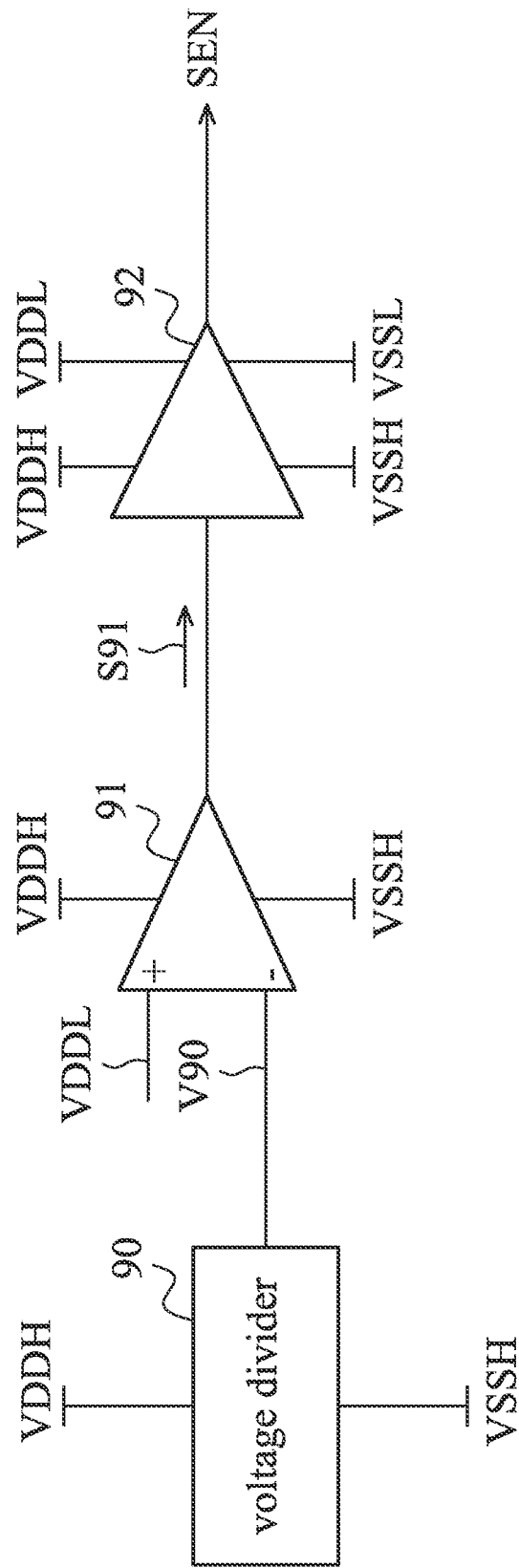
FIG. 9 shows an exemplary embodiment of circuit generating the enable signal shown in FIG. 5.

Referring to FIG. 9, an exemplary embodiment of circuit generating the enable signal shown in FIG. 5 may include a voltage divider 90, a comparator 91, and a level shifter 92. The voltage divider 90 is coupled to the I/O power voltage VDDH and the I/O ground voltage VSSH which vary with the specification of a core circuit coupled to the receiving circuit 3. The voltage divider 90 is capable of performing a voltage dividing operation according to the I/O power voltage VDDH and the I/O ground voltage VSSH to generate a divided voltage V90. In the embodiment, the level of the divided voltage V90 is substantially equal to 0.7*VDDH. The comparator 91 is capable of operating in the I/O power domain and receiving the I/O power voltage VDDH and the I/O ground voltage VSSH. The comparator 91 is capable of comparing the divided voltage V90 and the core power voltage VDDL of the core power domain and generating a comparison signal S91 according to the compared result. When the divided voltage V90 is substantially equal to or less than the core power voltage VDDL, the comparator 91 is capable of generating the asserted comparison signal S91. When the divided voltage V90 is greater than the core power voltage VDDL, the comparator 91 is capable of generating the de-asserted comparison signal S91. The level shifter 92 is capable of receiving the I/O power voltage VDDH and the I/O ground voltage VSSH of the I/O power domain and a core power voltage VDDL and a core ground voltage VSSL of a core power domain. The level shifter 92 is capable of receiving the comparison signal S91 and shifting the level of the comparison signal S91 to generate the enable signal SEN to the switch 50. When the level shifter 92 receives the asserted comparison signal S91, the level shifter 92 is capable of generating the asserted enable signal SEN with the level of the core power voltage VDDL. When the level shifter 92 receives the de-asserted comparison signal S91, the level shifter 92 is capable of generating the de-asserted enable signal SEN with the level of the core ground voltage VSSL. The circuit shown in FIG. 9 is a non-limiting example. In other embodiments, the circuit for generating the enable signal SEN can be implemented by other examples, for example, the circuit may comprise a resistor coupled to the core power voltage VDDL.

According to the generation of the enable signal SEN, the voltage clampers 300A and 300B are capable of passing the input signal SIN with the level being substantially equal to or lower than the first predetermined voltage level to serve as the clamped signal S300A and the reference signal SREF with the level being substantially equal to or lower than the second predetermined voltage level to the input buffer 301 according to the asserted enable signal SEN to serve as the clamped signal S300B, respectively. Moreover, when the input signal SIN has a level higher than the first predetermined voltage level and the reference signal SREF has a level higher than the second predetermined voltage level, the voltage clampers 300A and 300B provide the clamped signal S300A whose level is not higher than the first predetermined voltage level and the clamped signal S300B whose level is not higher than the second predetermined voltage level.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A receiving circuit for a core circuit comprising:
a first receiving-path unit capable of receiving an input signal and outputting an output signal to the core circuit according to the input signal;
wherein the first receiving-path unit comprises:
an input buffer capable of operating in a core power domain and receiving a first clamped signal;
a switch controlled by an enable signal and having an input terminal receiving the input signal and an output terminal providing the first clamped signal to the input buffer;

wherein when a level of the input signal is substantially equal to or lower than a first predetermined voltage level, the enable signal is asserted, and the switch is capable of being turned on according to the asserted enable signal to pass the input signal to the output terminal to serve as the first clamped signal, and the input buffer is capable of outputting the output signal in the core power domain according to the first clamped signal;

wherein when the level of the input signal is higher than the first predetermined voltage level, the enable signal is de-asserted, the switch is capable of being turned off according to the de-asserted enable signal, and the output terminal provides the first clamped signal whose level is substantially equal to a level of the enable signal;

wherein the enable signal is generated according to an input/output (I/O) power voltage and an I/O ground voltage and a core power voltage.

2. The receiving circuit as claimed in claim 1, wherein when the level of the input signal is higher than the first predetermined voltage level, the input signal is not passed to the input buffer.

3. The receiving circuit as claimed in claim 1, wherein the first receiving-path unit further comprises:

a voltage clamper capable of receiving the input signal and providing the first clamped signal to the input buffer;

wherein when the level of the input signal is higher than the first predetermined voltage level, the voltage clamper does not pass the input signal.

4. The receiving circuit as claimed in claim 1, wherein the level of the enable signal is not higher than the first predetermined voltage level.

5. The receiving circuit as claimed in claim 1, wherein the voltage clamper further comprises:

an electrostatic discharge protection unit coupled between the output terminal of the switch and a core ground voltage of the core power domain.

6. The receiving circuit as claimed in claim 1, wherein the voltage clamper further comprises:

a voltage divider coupled to the input/output (I/O) power voltage and the I/O ground voltage and capable of performing a voltage dividing operation according to the I/O power voltage and the I/O ground voltage to generate a divided voltage;

a comparator capable of comparing the divided voltage with the core power voltage of the core power domain and generating a comparison signal according to the compared result; and a level shifter capable of receiving the comparison signal and shifting a level of the comparison signal to generate the enable signal.

7. The receiving circuit as claimed in claim 6, wherein when the divided voltage is less than the core power voltage, the comparator is capable of generating an asserted comparison signal and the level shifter is capable of shifting the level of the asserted comparison signal to generate the asserted enable signal, and when the divided voltage is greater than the core power voltage, the comparator is capable of generating a de-asserted comparison signal and the level shifter is capable of shifting the level of the de-asserted comparison signal to generate the de-asserted enable signal.

8. The receiving circuit as claimed in claim 7, wherein the level shifter is capable of shifting the level of the asserted comparison signal to a level of the core power voltage and shifting the level of the de-asserted comparison signal to a level of a core ground voltage of the core power domain.

9. The receiving circuit as claimed in claim 1, wherein the first predetermined voltage level is a level of a core power voltage.

10. The receiving circuit as claimed in claim 1, wherein the first receiving-path unit is further capable of receiving a reference signal, and the input buffer is capable of receiving a second clamped signal ; and wherein when a level of the reference signal is substantially equal to or lower than a second predetermined voltage level which is substantially equal to or lower than the first predetermined voltage level, the reference signal is passed to the input buffer to serve as the second clamped signal, and the input buffer is capable of outputting the output signal in the core power domain according to the first clamped signal and the second clamped signal.

11. The receiving circuit as claimed in claim 10, wherein the first receiving-path unit further comprises:

a voltage clamper capable of receiving the reference signal and providing the second clamped signal to the input buffer;

wherein when the level of the reference signal is substantially equal to or lower than the second predetermined voltage level, the voltage clamper is capable of passing the reference signal to serve as the second clamped signal; and wherein when the level of the reference signal is higher than the second predetermined voltage level, the voltage clamper does not pass the reference signal, and the voltage clamper is capable of providing the second clamped signal whose level is not higher than the second predetermined voltage level.

12. The receiving circuit as claimed in claim 10, wherein the input buffer is a differential receiver.

13. The receiving circuit as claimed in claim 10, wherein the level of the reference signal is a half of a level of an input/output (I/O) power voltage.

14. A receiving circuit for a core circuit comprising:

a first receiving-path unit capable of receiving an input signal and outputting a first output signal to the core circuit according to the input signal, wherein the first receiving-path unit comprises:

a first input buffer capable of operating in a core power domain and receiving a first clamped signal;

wherein when a level of the input signal is substantially equal to or lower than a first predetermined voltage level, the input signal is passed to the first input buffer to serve as the first clamped signal, and the first input buffer is capable of outputting the first output signal in the core power domain according to the first clamped signal; and a second receiving-path unit capable of receiving the input signal and outputting a second output signal to the core circuit according to the input signal, wherein the second receiving-path unit comprises:

a second input buffer capable of operating in an input/output (I/O) power domain, receiving the input signal, and outputting a first buffer signal according to the input signal; and a first level shifter capable of receiving the first buffer signal and shifting a level of the first buffer signal to generate the second output signal in the core power domain.

15. The receiving circuit as claimed in claim 14, wherein the second input buffer is further capable of receiving a reference signal and outputting the first buffer signal according to the input signal and the reference signal.

16. The receiving circuit as claimed in claim 14 further comprising a third receiving-path unit capable of receiving the input signal and a reference signal and outputting a third output signal according to the input signal and the reference signal, wherein the third receiving-path unit comprises:

a third input buffer capable of operating in the I/O power domain, receiving the input signal and the reference signal, and outputting a second buffer signal according to the input signal and the reference signal; and a second level shifter capable of receiving the second buffer signal and shifting a level of the second buffer signal to generate the third output signal in the core power domain.

17. The receiving circuit as claimed in claim 16, wherein when the core circuit is a low power double data rate II (LPDDRII) memory, the core circuit receives the first output signal.

18. The receiving circuit as claimed in claim 16, wherein when the core circuit is a mobile double data rate (DDR) or single data rate (SDR) memory, the core circuit receives the second output signal.

19. The receiving circuit as claimed in claim 16, wherein when the core circuit is a double data rate I (DDRI), DDRII, or DDRIII memory, the core circuit receives the third output signal.

20. The receiving circuit as claimed in claim 14, wherein the first input buffer comprises at least one transistor, the second input buffer comprises at least one transistor, and a gate dielectric of the transistor of the first input buffer is thinner than a gate dielectric of the transistor of the second input buffer.

* * * * *